(12) United States Patent
Chen et al.

(10) Patent No.: US 6,977,210 B1
(45) Date of Patent: Dec. 20, 2005

(54) METHOD FOR FORMING BIT LINE CONTACT HOLE/CONTACT STRUCTURE

(75) Inventors: Meng-Hung Chen, Taoyuan (TW); Chia-Sheng Yu, Banciao (TW)

(73) Assignee: NANYA Technology Corporation, Taoyuan (TW)

( * ) Notice: Subject to any disclaimer, the term of this patent is extended or adjusted under 35 U.S.C. 154(b) by 0 days.

(21) Appl. No.: 10/862,570

(22) Filed: Jun. 8, 2004

(51) Int. Cl.⁷ .............................................. H01L 21/44
(52) U.S. Cl. ..................................... 438/597; 438/723
(58) Field of Search ............................... 438/597, 705, 438/706, 723, 702

(56) References Cited

U.S. PATENT DOCUMENTS

| | | | | |
|---|---|---|---|---|
| 5,723,381 | A  * | 3/1998 | Grewal et al. ............... | 438/633 |
| 6,033,977 | A  * | 3/2000 | Gutsche et al. ............. | 438/618 |
| 6,808,984 | B1 * | 10/2004 | Chen ........................... | 438/256 |
| 6,821,872 | B1 * | 11/2004 | Liao et al. ................... | 438/586 |
| 2003/0109124 | A1 * | 6/2003 | Nakamura et al. .......... | 438/597 |
| 2003/0181007 | A1 * | 9/2003 | Huang et al. ................ | 438/257 |

FOREIGN PATENT DOCUMENTS

| | | | | |
|---|---|---|---|---|
| JP | 08046154 A | * | 2/1996 | ......... H01L 27/108 |
| JP | 08130195 A | * | 6/1996 | ........... H01L 21/28 |
| JP | 2000216242 A | * | 8/2000 | ......... H01L 21/768 |

* cited by examiner

*Primary Examiner*—Caridad Everhart
(74) *Attorney, Agent, or Firm*—Bacon & Thomas, PLLC

(57) ABSTRACT

Disclosed is a method for forming a bit line contact hole/contact structure. The method of the present invention includes steps of providing a substrate; forming a plurality of word line structures on the substrate; forming a doped dielectric layer on the substrate having the word line structures formed thereon; defining a position for forming a bit line contact hole; removing the doped dielectric layer other than the portion at the position for forming the bit line contact hole; forming a non-doped dielectric layer on the substrate having the word line structures and residual doped dielectric layer formed thereon; removing the residual doped dielectric layer by using an etchant with a high selectivity for doped dielectric layer/non-doped dielectric layer to form a bit line contact hole; and filling the bit line contact hole with conductive material to form a bit line contact structure.

12 Claims, 4 Drawing Sheets

METHOD FOR FORMING BIT LINE CONTACT HOLE/CONTACT STRUCTURE

BACKGROUND OF THE INVENTION

1. Field of the Invention

The present invention relates to a semiconductor device process, more specifically, to a method for forming bit line contact hole/contact structure.

2. Description of the Prior Art

In the manufacturing process for DRAM, forming a bit line contact structure between two word line structures is a common procedure.

FIG. 1 is a schematic structure diagram showing a bit line contact hole formed between two word line structures. In the drawing, reference number 10 indicates a silicon substrate, 12 indicates a word line structure formed on the silicon substrate 10. In current process, each word line structure 12 generally comprises a conductive portion having a metal layer 121 (of which the material can be WSi) and a polysilicon layer 123, and a protective layer 13. Generally, the material of the protective layer 13 is nitride, such as SiN. The protective layer 13 is formed to cover the conductive portion of the word line structure and also cover the whole silicon substrate with a thin layer, as shown in the drawing. Then, a first dielectric layer 14, of which the material is generally BPSG, is formed on the whole structure. Considering of strain problem, a second dielectric layer 16 is formed on the first dielectric layer 14. The material of the second dielectric layer 16 is generally oxide without being doped with dopant selected from group III or V, such as TEOS.

Dry etch is used to remove the selected position of the TEOS layer and BPSG layer to form a bit line contact hole 18. Due to the property of the etchant, such an etching process will stop at the SiN layer, as shown in FIG. 1. Then the SiN portion at the bottom of the contact hole 18 is removed to make an access to the silicon substrate. This process is generally referred to SAC (self-aligned contact hole) etching. Among current SAC etching techniques, RIE (reactive ion etching) combining a physical etching (for verticality of the etched profile) and a chemical etching (for etch selectivity) is the most widely used. In this method, the etching is performed by chemical action and ion bombard.

However, as DRAM becomes more compact, the critical dimensions of various structures including the bit line contact structure is required to be compressed. In other words, the critical dimension of the contact hole becomes smaller and smaller. Under such circumstances, the chemical action in the etching process usually fails to clearly remove the predetermined portion of the dielectric layers (TEOS and BPSG), and therefore the assistance of the physical process (i.e. the ion bombard) is necessary. However, enhancing the ion bombard to remove the predetermined portion of the dielectric layers often damages shoulder portions 19 of the word line structure, as shown in FIG. 1. When the protective layer at the shoulder portion 19 is damaged to a certain degree, the conductive layer under the protective layer will be exposed. Under such circumstances, when the bit line contact hole is filled with metal to form a bit line contact structure, improper short circuit will happen to the bit line and the word line, which will be formed later.

Therefore, there is a need for a solution to overcome the problem stated above. The present invention satisfies such a need.

SUMMARY OF THE INVENTION

An objective of the present invention is to provide a novel method for forming a bit line contact structure, which can eliminate the need for assistance of ion etch, so that a contact hole and accordingly the contact structure can be formed with a good profile, thereby preventing a protective layer of a word line structure from being damaged. Otherwise, an improper short circuit may occurr between the bit line and word line.

According to an aspect of the present invention, a method for forming a bit line contact structure comprises steps of providing a substrate; forming a plurality of word line structure on said substrate to form a first mediate structure; forming a doped dielectric layer on said mediate structure; defining a position on said doped dielectric layer where a bit line contact hole is to be formed; removing said doped dielectric layer except for the portion at the position where the bit line contact hole is to be formed to form a second mediate structure; forming a non-doped dielectric layer on said second mediate structure; removing the retained doped dielectric layer by using an etchant having a high selectivity to the doped dielectric layer with respect to the non-doped dielectric layer to form the bit line contact hole; and filling said bit line contact hole with conductive material to form a bit line contact structure.

According to another aspect of the present invention, in the method for forming a bit line contact structure, the material of said doped dielectric layer is an oxide doped with any element from group III/V, while the material of said non-doped dielectric layer is an oxide without being doped with any element from group III/V.

According to a further aspect of the present invention, in the method for forming a bit line contact structure, the material of said doped dielectric layer is BPSG (boron phosphorus silicon glass), while the material of said non-doped dielectric layer is HDP (high density plasma) oxide.

According to still a further aspect of the present invention, in the method for forming a bit line contact structure, said etchant is VHF (vapor HF).

According to still a further aspect of the present invention, in the method for forming a bit line contact structure, a liner nitride layer is formed on the periphery of the retained doped dielectric layer after removing said doped dielectric layer except for the portion at the position where the bit line contact hole is to be formed.

BRIEF DESCRIPTION OF THE DRAWINGS

The following drawings are only for illustrating the mutual relationships between the respective portions and are not drawn according to practical dimensions and ratios. In addition, the like reference numbers indicate the similar elements.

DETIALED DESCRIPTION OF THE PREFERRED EMBODIMENT

An embodiment of the present invention will be described in detail with reference to the accompanying drawings.

Figure 1:
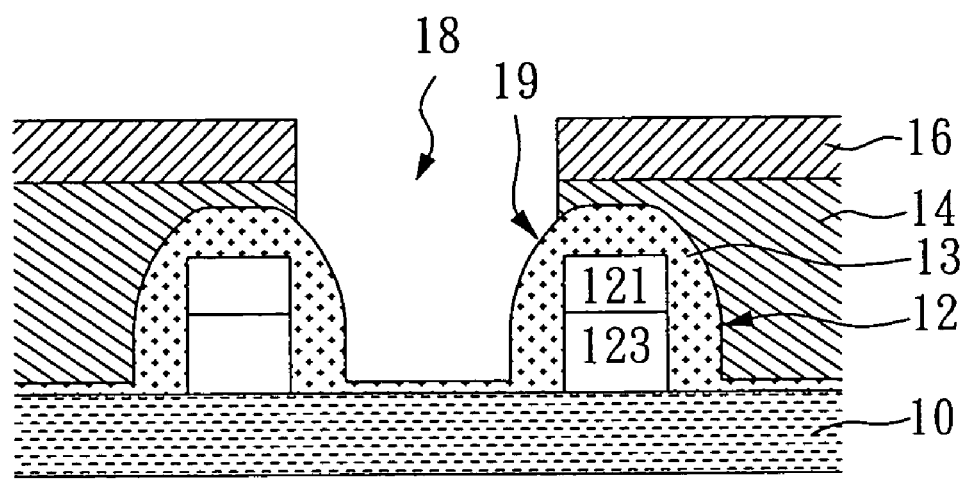
FIG. 1 is a structure schematic diagram showing a bit line contact hole formed between two word line structures.
Figure 2A:
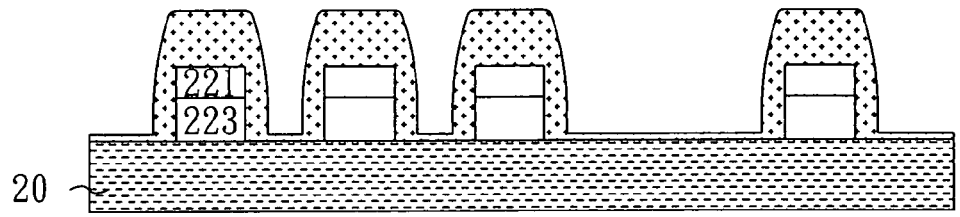
FIGS. 2a to 2l illustrate the respective steps of a method for forming a shallow trench in a deep trench structure in accordance with the present invention.

As shown in FIG. 2a, a plurality of word line structures 22 are formed on a silicon substrate 20. Each word line structure 22 comprises a conductive portion composed of a metal layer 221 and a poly-silicon layer 223. Reference number 23 indicates a nitride layer, of which the material can be SiN. Although the word line structure is described as an example in the embodiment in accordance with the present invention, the present invention can also be applied to other operation structures. The silicon substrate and the operation layers such as word line structure is referred to a mediate structure.

Figure 2B:
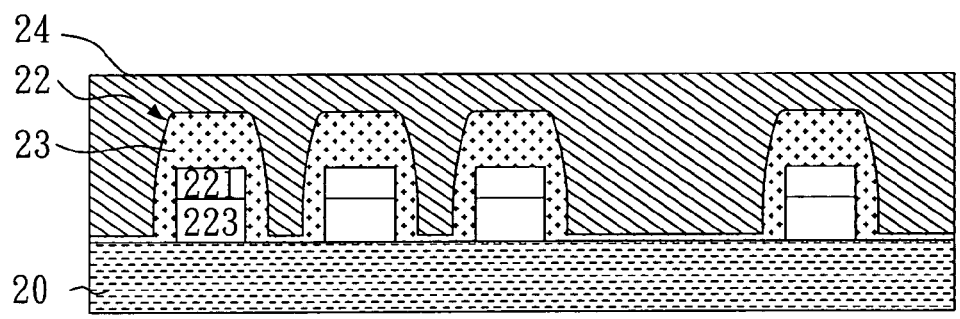

A doped dielectric layer 24 is formed on the mediate structure. The dopant is preferably the element from group III/V. In this embodiment, the material of the doped dielectric layer is a doped silicon oxide, such as BPSG (boron phosphorus silicon glass). Then, planarization process is performed to the doped dielectric layer 24, as shown in FIG. 2b.

Figure 2C:
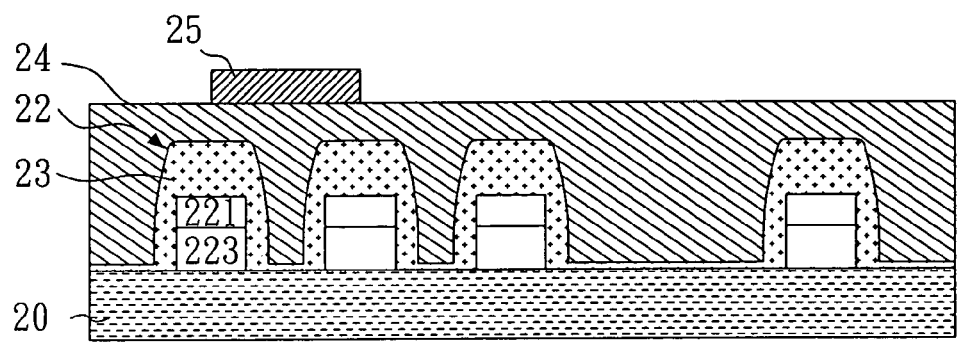

A position where a bit line contact hole is to be formed is defined by photoresist layer 25, as shown in FIG. 2c.

Figure 2D:
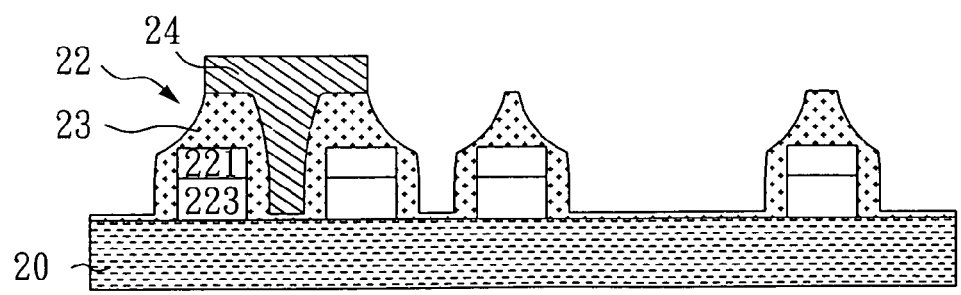

The portion of the BPSG layer which is not covered by the photoresist layer 25 is etched and removed, then the photoresist layer 25 is removed, and the resultant structure is shown in FIG. 2d. As can be seen from the drawing, only the portion of the BPSG layer at the predetermined position where the bit line contact hole is to be formed is retained, while the other portions of the BPSG layer are all removed.

Figure 2E:
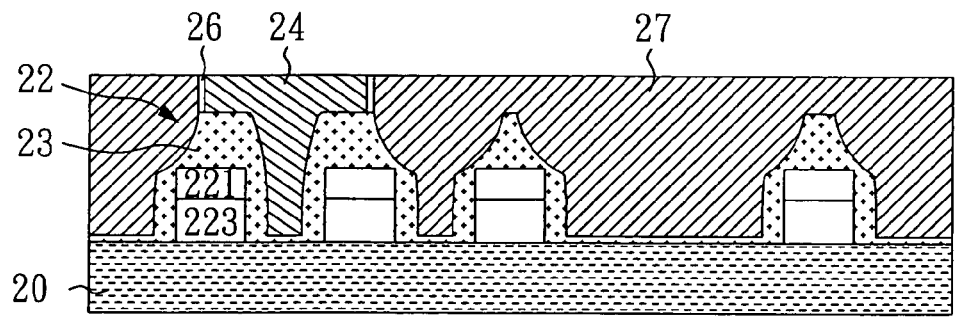

Subsequently, a liner nitride layer 26 is formed at the periphery of the retained portion of the BPSG layer, then a non-doped dielectric layer 27 is formed on the whole structure, and planarization process is formed to expose the top surface of the portion of the BPSG layer at the position where the bit line contact hole is to be formed, as shown in FIG. 2e. The objective of the liner nitride layer 26 is to prevent short circuit happening between the contact structures if the filling capability of the non-doped dielectric layer 27 is not sufficiently good. The material of the non-doped dielectric layer 27 can be any proper non-doped dielectric material, such as silicon oxide without being doped with any element from group III/IV, HDP (high density plasma) oxide, SOG (spin-on-glass) and low-K dielectric material. In the present embodiment, HDP oxide is used, since such a material is easy to be planarized and the process thereof is well known currently. However, for the material property, the low-K dielectric material is more preferred. Although the nitride layer 23 of the word line structure 22 may be damaged in the etching process for removing the BPSG layer, the non-doped dielectric layer 27, which is also a dielectric layer, formed on the word line structure 22 also has the effect to protect the conductive portion of the word line structure. Accordingly, the electrical property of the word line structure will not be influenced.

Figure 2F:
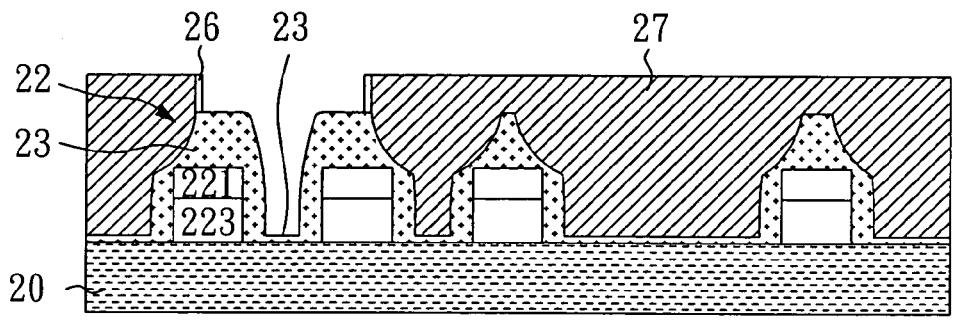

Then, the retained BPSG layer 24 is removed by VHF (vapor HF) etching to form a bit line contact hole, as shown in FIG. 2f. VHF has a property that the etch selectivity thereof to the dielectric material (more specifically, oxide material) doped with any element from group III/V is very high with respect to the dielectric material (more specifically, oxide material) without being doped. That is, the doped oxide layer (e.g. BPSG) is very easy to remove by using VHF, but the non-doped oxide layer (e.g. HDP oxide) is almost not removed at all. Accordingly, the doped dielectric layer (BPSG) 24 can be removed, while the non-doped dielectric layer (HDP oxide) 27 can be maintained by using VHF etching.

Figure 2G:
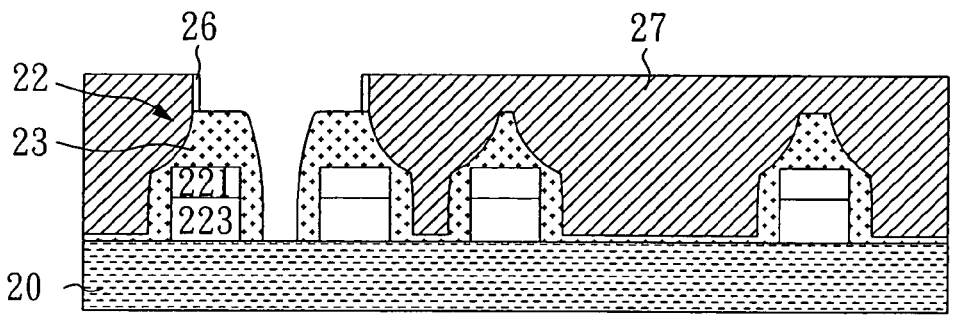

The portion of the nitride layer at the bottom of the bit line contact hole is opened, so that the silicon substrate 20 below is exposed, as shown in FIG. 2g.

Figure 2H:
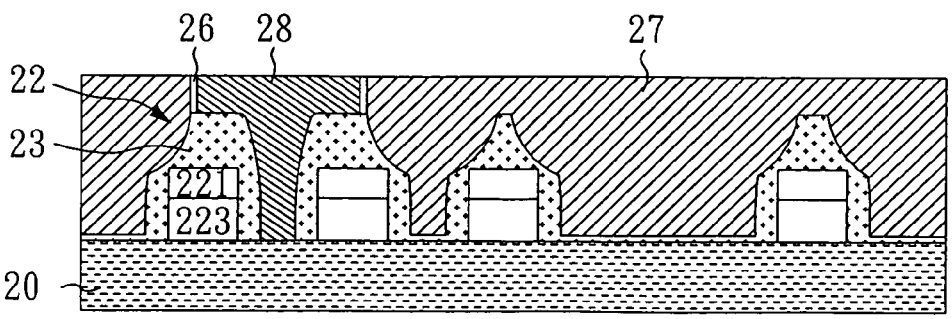

The bit line contact hole is filled with conductive material 28 to form a bit line contact structure, and then planarization process is applied thereto, as shown in FIG. 2h.

The subsequent steps for forming bit lines and other contact structures, such as a substrate contact structure, are the same as known conventional techniques, and therefore the descriptions thereof are omitted herein.

Figure 2I:
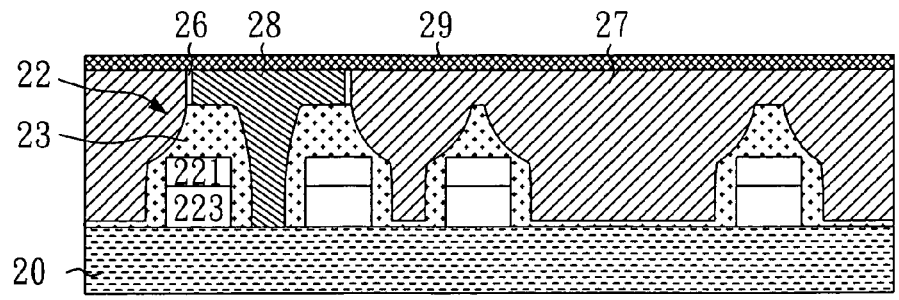

A dielectric layer 29, of which the material can be TEOS, is formed on the whole structure, as shown in FIG. 2i.

Figure 2J:
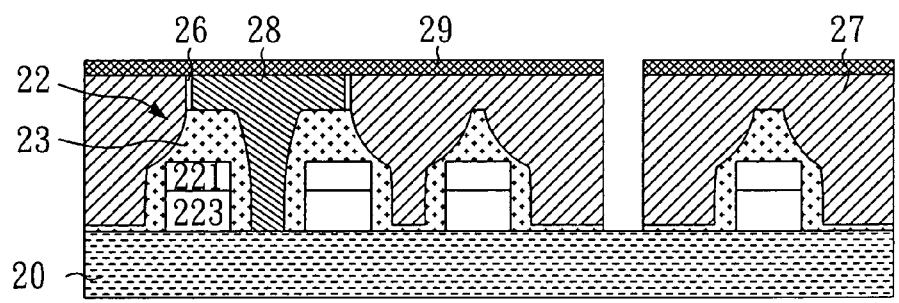

FIG. 2j shows a substrate contact hole is formed in the structure by using conventional photoresist-defining/etching process.

Figure 2K:
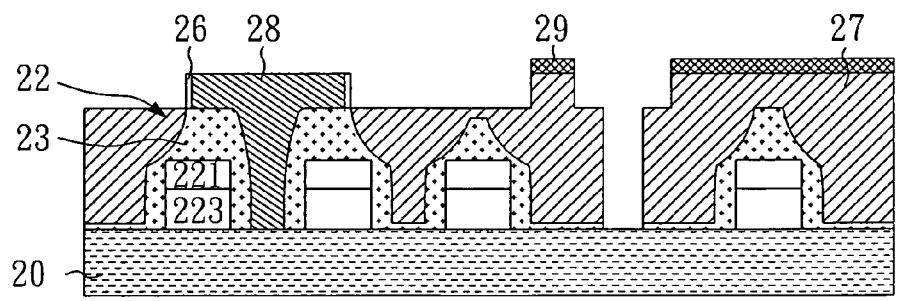

Then, a portion of the TEOS layer 29 is removed by using conventional photoresist-defining/etching process to form a recess, as shown in FIG. 2k. During the etching, some of the non-doped dielectric (HDP oxide) layer 27 may also be removed, however, it will not make significant negative influence.

Figure 2L:
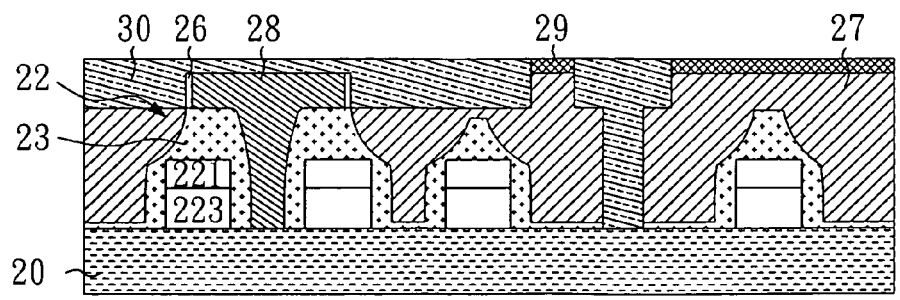

Finally, the recess and contact hole are filled with conductive material such as metal to form a bit line 30 and substrate contact structure, as shown in FIG. 2l.

While the embodiment of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications and alterations which maintain the spirit and realm of the present invention are within the scope as defined in the appended claims.

What is claimed is:

1. A method for forming a bit line contact hole comprising steps of:
   providing a substrate;
   forming a plurality of word line structures on said substrate;
   forming a nitride layer to cover said word line structures to form a first mediate structure;
   forming a doped dielectric layer on said first mediate structure;
   defining a position on said doped dielectric layer where the contact hole is to be formed;
   removing said doped dielectric layer except for the portion at the position where the contact hole is to be formed to form a second mediate structure;
   forming a liner nitride layer on the periphery of the retained doped dielectric layer;
   forming a non-doped dielectric layer on said second mediate structure; and
   removing the retained doped dielectric layer by using an etchant having a high selectivity to the doped dielectric layer with respect to the non-doped dielectric layer to form the contact hole.

2. The method as claimed in claim 1, wherein the material of said doped dielectric layer is an oxide doped with any element from group III/V, while the material of said non-doped dielectric layer is an oxide without being doped with any element from group III/IV.

3. The method as claimed in claim 2, wherein the material of said doped dielectric layer is BPSG (boron phosphorus silicon glass).

4. The method as claimed in claim 2, wherein the material of said non-doped dielectric layer is low-K dielectric material, HDP (high density plasma) oxide or SOG (spin-on-glass).

5. The method as claimed in claim 1, wherein said etchant is VHF (vapor HF).

6. The method as claimed in claim 1, wherein the position where the contact hole is to be formed is defined by a photoresist layer, then the portion of the doped dielectric layer not covered with the photoresist layer is removed.

7. A method for forming a bit line contact structure comprising steps of:
   providing a substrate;
   forming a plurality of word line structures on said substrate;
   forming a nitride layer to cover said word line structures to form a first mediate structure;
   forming a doped dielectric layer on said first mediate structure;
   defining a position on said doped dielectric layer where a contact hole is to be formed;
   removing said doped dielectric layer except for the portion at the position where the contact hole is to be formed to form a second mediate structure;
   forming a liner nitride layer on the periphery of the retained doped dielectric layer;
   forming a non-doped dielectric layer on said second mediate structure;
   removing the retained doped dielectric layer by using an etchant having a high selectivity to the doped dielectric layer with respect to the non-doped dielectric layer to form a contact hole, and
   filling said contact hole with conductive material to form a contact structure.

8. The method as claimed in claim 7, wherein said etchant is VHF (vapor HF).

9. The method as claimed in claim 7, wherein the position where the contact hole is to be formed is defined by a photoresist layer, then the portion of the doped dielectric layer not covered with the photoresist layer is removed.

10. The method as claimed in claim 7, wherein the material of said doped dielectric layer is an oxide doped with any element from group III/V, while the material of said non-doped dielectric layer is an oxide without being doped with any element from group III/V.

11. The method as claimed in claim 10, wherein the material of said doped dielectric layer is BPSG (boron phosphorus silicon glass).

12. The method as claimed in claim 10, wherein the material of said non-doped dielectric layer is low-K dielectric material, HDP (high density plasma) oxide or SOG (spin-on-glass).

* * * * *